United States Patent [19]

Appelbaum

[11] Patent Number: 4,994,142
[45] Date of Patent: Feb. 19, 1991

[54] ELIMINATING UNDERCUTTING OF MASK MATERIAL WHEN ETCHING SEMICONDUCTOR TOPOGRAPHY BY NATIVE OXIDE REMOVAL

[75] Inventor: Ami Appelbaum, Plano, Tex.

[73] Assignee: Rockwell International Corporation, El Segundo, Calif.

[21] Appl. No.: 247,839

[22] Filed: Sep. 22, 1988

[51] Int. Cl.$^5$ .................. H01L 21/308; C25F 3/12
[52] U.S. Cl. .................. 156/647; 156/651; 156/656; 156/657; 156/659.1; 437/228
[58] Field of Search ............... 156/647, 651, 655, 656, 156/659.1, 657; 427/309; 437/228

[56] References Cited

U.S. PATENT DOCUMENTS 4,354,898 10/1982 Coldren et al. ............... 156/647
4,436,584 3/1984 Bernacki et al. ............ 156/659.1
4,797,179 1/1989 Watson et al. ............... 156/647

OTHER PUBLICATIONS

Wolf et al., Silicon Processing for the VLSI Era, vol. 1—Process Technology, Lattice Press, Sunset Beach, Calif., p. 520.

*Primary Examiner*—David L. Lacey
*Assistant Examiner*—Todd J. Burns
*Attorney, Agent, or Firm*—Bruce C. Lutz; V. Lawrence Sewell; H. Fredrick Hamann

[57] ABSTRACT

It has been determined that etchants which are used in forming the topography of a semiconductor device act to etch very quickly semiconductor oxides as compared to the action on the semiconductor material itself. If the oxides are immediately below the surface of the etchant mask, undercutting of the mask will occur and etched grooves will vary in width and shape. Thus, it is imperative in order to obtain consistent and repeatable etching action, that all native oxides be removed from the surface of the semiconductor to be etched, and that they be prevented from forming between the semiconductor material and the mask. This is accomplished by making sure that after removing the native oxide material from the surface to be masked and etched, the body is placed in an oxygen free environment before its temperature is raised to a temperature at which further native oxides may form. Thus, undercutting or underetching of the mask is prevented.

9 Claims, 3 Drawing Sheets

ELIMINATING UNDERCUTTING OF MASK MATERIAL WHEN ETCHING SEMICONDUCTOR TOPOGRAPHY BY NATIVE OXIDE REMOVAL

THE INVENTION

This invention is directed generally at defining the topography of a single crystal semiconductor body, and more specifically, at preventing the undercutting of a mask (masked) area during the etching process so that consistent and repeatable results are obtained in the topography definition process.

BACKGROUND OF THE INVENTION

It has been realized in the past that if an oxide is allowed to form on the surface of a semiconductor between the main body of the semiconductor and an etch mask, that there will be undercutting of the mask in the areas of the oxide and the semiconductor based material will be etched, where the desired action is a groove, to be wider than the mask area supposedly defining the width of the groove. Typically, any natural (naturally occurring as opposed to actively generated) oxides which are formed on the semiconductor are uneven in thickness or depth, and thus, the etched groove has varying amounts of undercutting and the groove width is not uniform. If the desired action is to have a mesa of a constant width as opposed to a groove, the same detrimental effects occur. In other words, the mesa is not as wide as the mask and the mesa is not uniform in its dimensions.

It has often been found in the past that, even though the semiconductor material is cleaned with a cleaning agent or solution such as hydrogen fluoride (HF) or sulfuric acid (H2SO4), an uncontrolled amount of oxide is formed on the surface and in varying thicknesses between the base semiconductor and the mask as applied. One attempt to compensate for this problem is shown by a U.S. Pat. No. 4,595,454 in the name of Dautremont-Smith et al. The process described in the patent is to generate a prescribed thickness layer of oxide surface area in an oxygen rich atmosphere after the cleaning process, so that any naturally formed oxides are of a relatively small thickness, compared to the intentionally added oxide, and with this added oxide, the undercutting would be reasonably uniform.

The present method was formulated by the present inventor after a considerable amount of study revealed that the natural oxide was being formed accidentally by subjecting the semiconductor body to temperatures whereby oxides would form prior to the removal of oxygen from the environment in which the body was placed. This often occurred due to the placing of the semiconductor bodies in a plasma deposition system environment, whereby contact with the hot surfaces therein would immediately start forming oxides. These oxides may also form with time at room temperatures. (Typically, no more than ten minutes may be allowed to lapse between cleaning and the removal of an oxygen environment.) The thickness of the oxides formed depending upon various parameters, such as cleaning procedures, location of heat source and thermal conductivity of the semiconductor body before the environment within the furnace had been replaced by an oxygen-free atmosphere.

Thus the present invention comprises cleaning the surface of the semiconductor of all oxides (if any) at a temperature, such as room temperature, which will not result in the formation of any additional natural oxides. The body must quickly be placed in an atmosphere that is oxygen free (typically less than ten minutes). In other words, the environment is brought down to room temperature before the semiconductor bodies are placed therein and the evacuation of all the oxygen from the environment is performed before the temperature is raised.

It is thus an object of the present invention to provide an improved method of defining the topography of a semiconductor body through the use of etchant masks and etchants to improve the consistency and definition of grooves and mesas to be formed on the semiconductor surface.

BRIEF DESCRIPTION OF THE DRAWINGS

Other objects and advantages of the present invention will be ascertained from a reading of the specification and appended claims in conjunction with the drawings wherein:

DETAILED DESCRIPTION

Figure 1:
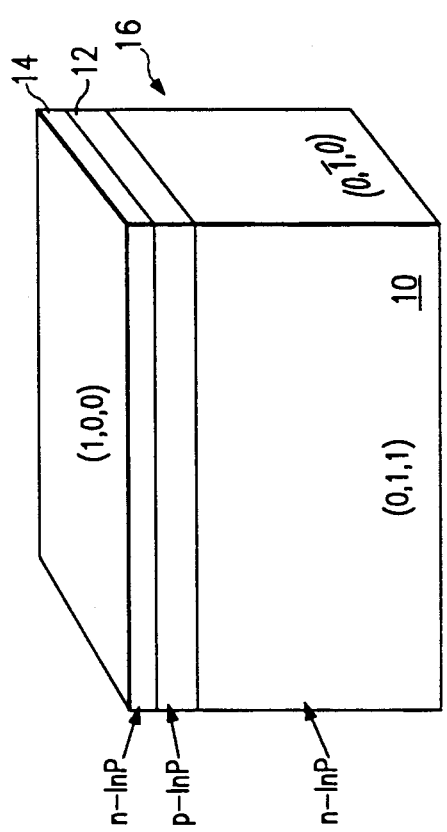
FIG. 1 is a representation of a semiconductor body with epitaxially grown current blocking layers after being cleaned of all naturally occurring hydrocarbons and oxides and which is to be formed into a laser device.

In FIG. 1, a block of single crystal semiconductor material having a base portion of n-type indium phosphide (n-InP) is shown as 10. A layer of epitaxially grown p-type indium phosphide is shown as 12, and a further layer of n-type indium phosphide 14 is shown on the upper surface of the block of FIG. 1. The upper surface of layer 14 is said to have a crystal plane or orientation of (1,0,0). This orientation, as well as the rest of the orientations defined throughout the specification are known by those skilled in the art as Miller Indices and are used as a way of uniquely defining crystalline structure and its orientation for the purposes of uniformity in identifying characteristics of a crystalline structure.

An end portion of the entire object of FIG. 1, which will be referred to generally as a body 16, has a crystalline plane of (0,−1,1). Although the official nomenclature used by those skilled in the art and as shown in the drawings have a bar above a 1 to define the middle parameter of this plane, all use throughout the rest of the specification and claims will use the minus (−) in front of the 1, and place this information within parenthesis. This is not to define a new convention, but rather to use an accepted alternate convention in the text material and to ease the presentation of the material subject to the limitations of Applicant's printer. The front surface of block or body 16 has a crystal plane of (0,1,1).

Figure 2:
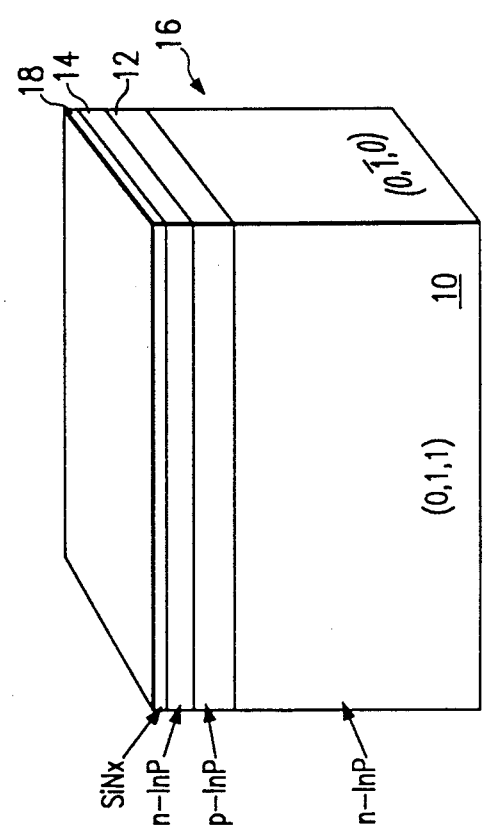
FIG. 2 is a representation of FIG. 1 with the addition of mask material.

FIG. 2 is the same as FIG. 1 with the addition of a silicon nitride (SiNx) where x is within the range of 0.2 to 1. (The silicon and nitrogen do not form stoichiometric molecules, but rather, form molecules with random ratios of elements in accordance with the formation environment.) Silicon nitride is an insulator and in the present instance is used as a mask for the topography of FIG. 3.

Figure 3:
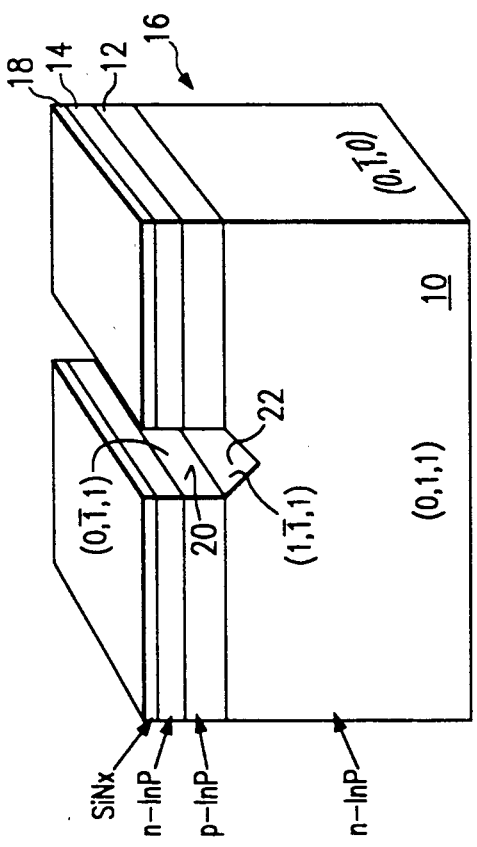
FIG. 3 is a representation of the body of FIG. 2 after the mask has been defined and the body has been subjected to etchant.

In FIG. 3, the body 16 is shown after the mask 18 has been defined using standard mask definition techniques, and an etchant of some composition such as hydrogen chloride (HCl) or HBr;H3PO4;K2Cr2O7;H2O, (Hydrogen Bronide, Phosphoric acid, Potassium Dichromate and Water), is used to define a slot, groove or channel through the silicon nitride 18, the top layer of n-type indium phosphide 16, and the layer of p-type indium phosphide 12, and slightly into the base layer 10 of n-type indium phosphide. A surface 20 is shown which is essentially vertical and has the same (0,−1,1) orientation as the end of the block. The etchant operates in a manner such that molecules are removed in the (1,1,1) orientation family so that a V-shaped portion progresses downward while leaving a vertical plane 20 of removed material. When the proper depth of the groove is reached, the body is removed from the etchant bath. This sloped surface is given the designation of 22 and for the orientation shown is (1,−1,1).

Figure 4:
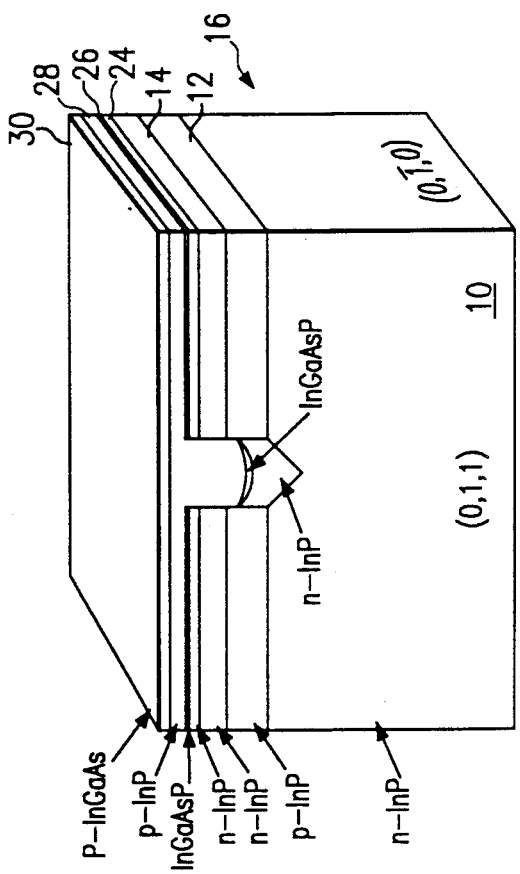
FIG. 4 is a representation of the semiconductor body after several layers of material have been grown on the body of FIG. 3.

In FIG. 4, the body 16 is shown with the silicon nitride layer 18 removed and additional layers of material grown on top of the layer 14 and within the channel. A first layer that is shown is layer 24 of n-type indium phosphide, which is shown as a relatively thin layer on the horizontal portion, but which grows very rapidly within the groove. A next layer 26 of indium gallium arsenide phosphide (InGaAsP) is shown. Again, it is deposited more heavily within the grooved area. A further layer 28 of p-type indium phosphide is shown on top of layer 26, and a final layer 30 of p-type indium gallium arsenide (InGaAs) is shown.

Figure 5:
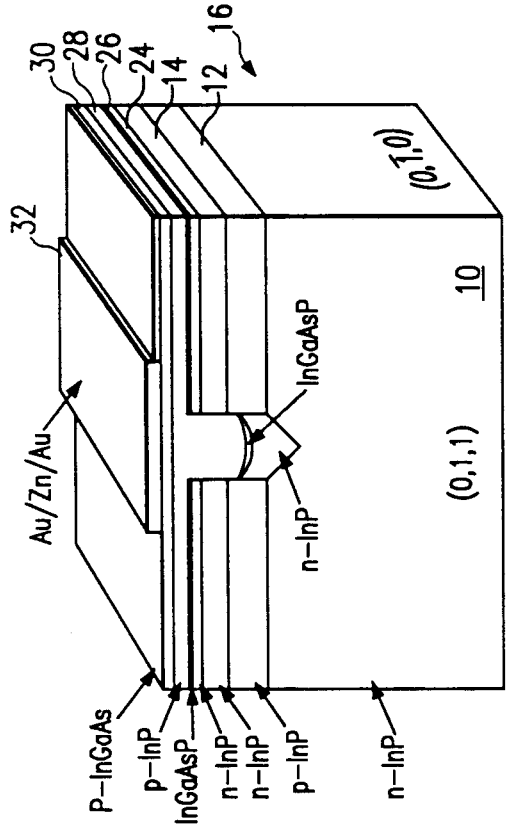
FIG. 5 shows the laser body after the device of FIG. 4 has been metalized on the p-side.

In FIG. 5, a metallization layer 32 is shown on top of the layer 30, mainly overlying the previously defined slot. This layer 32 is comprised of successive layers of gold (Au), zinc (Zn), and gold again. These layers are very thin and under high temperatures tend to diffuse one into another.

Figure 6:
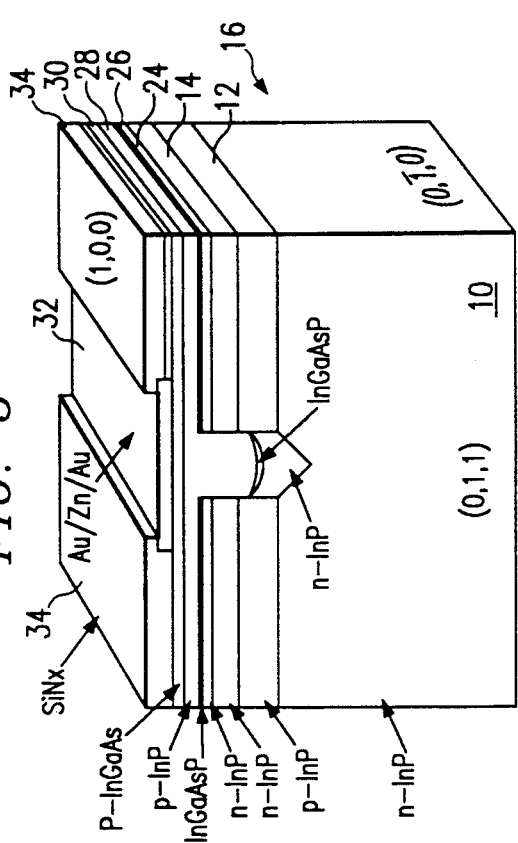
FIG. 6 shows the device of FIG. 5 with the addition of an insulating layer of deposited material.
Figure 7:
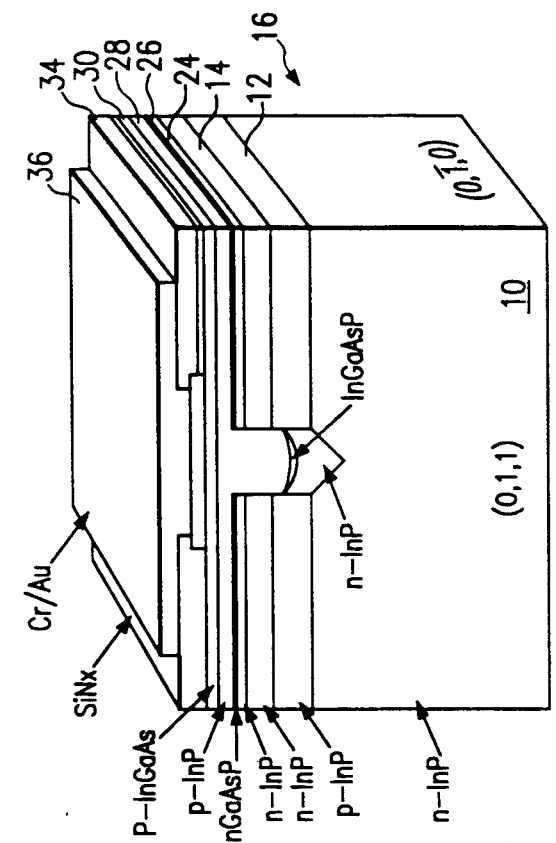
FIG. 7 depicts the addition to FIG. 6 of a bond pad.

In FIG. 6, using masking techniques etc., silicon nitride is deposited as a layer 34 on either side of the metal layer 32 and on the (1,0,0) surface of body 16. The silicon nitride deposition can be the same material as the original material 18, but is merely acting as an insulator for a metallization layer 36 as shown in FIG. 7. Layer 36 is comprised of chromium (Cr) and gold. Again, these layers are very thin layers. The layer 36 is used for the purpose of providing a large enough space to connect a bond wire to one terminal of the laser device.

Figure 8:
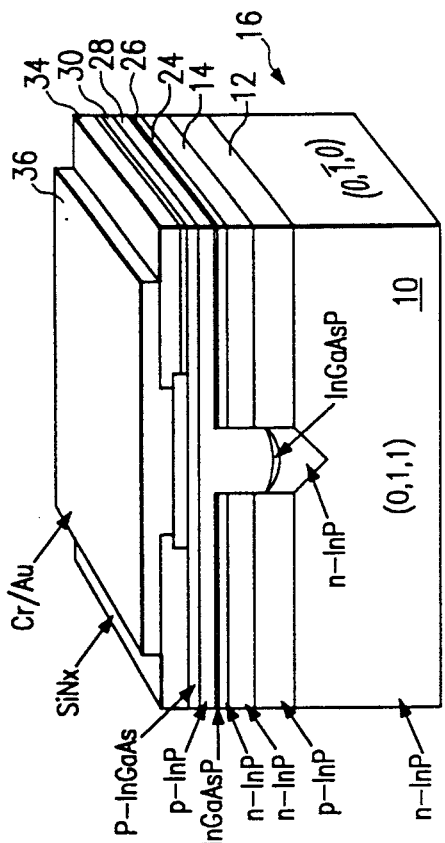
FIG. 8 represents the modification of FIG. 7 by reducing the thickness of the main body portion.

In FIG. 8, the base portion 10 of n-type indium phosphide is ground, etched or otherwise reduced in thickness so that the wafer can be more accurately cleaved into the proper size for forming mirrors for laser chips. Finally, a layer 38 is added to the underside of body 16. This layer 38 is comprised of gold and germanium (Ge). Again, this metallization comprises very thin layers which tend to intermix under high temperatures. The layer 38 provides the other electrical terminal for use in the finished laser product.

Figure 10:
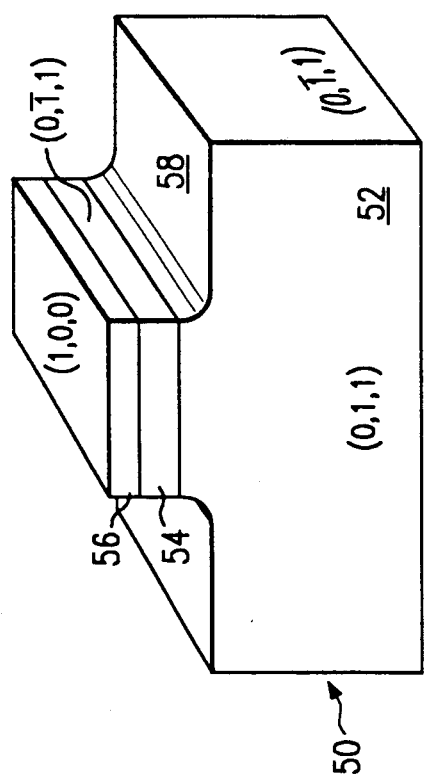
FIG. 10 is a representation of a mesa formed on a semiconductor body.

In FIG. 10, a further body, generally shown as 50, comprises a base material 52 oriented in the same manner as the body of FIG. 1, wherein the frontal crystalline plane is a (0,1,1) and the end plane is (0,−1,1). Again, the top surface has a crystalline plane of (1,0,0). On top of portion 52, there is a mesa comprised of material layers 54 and 56. When the mesa area 56 is protected by a mask, such as mask 18 of FIG. 1, the sides will be vertical in a manner identical to that shown for a groove of FIG. 3. FIG. 10 is merely shown to illustrate that the concept works not only in etching channels in semiconductor material, but also works to produce any topography relief such as mesas. While the body 50 is shown comprised of several different materials with layers 54 and 56 on top of 50, the concept still works substantially identically even if the whole body 50 is comprised of a single material. As further shown, the etchant (typically of a different type than would be used to define a slot) has eaten away a portion of material 52 of body 50, and the etched surface away from the mesa portion will be a reasonably flat and smooth crystalline surface such as designated by the number 58.

Figure 11:
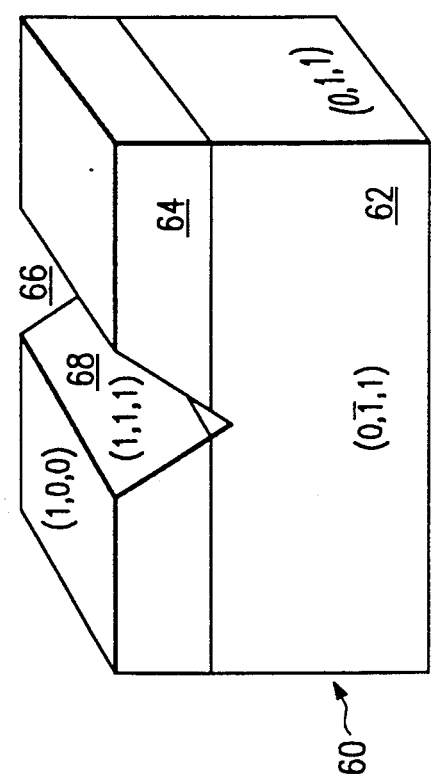
FIG. 11 is a representation of a V-shaped groove formed in the semiconductor body at right angles (relative defined crystalline planes) to the groove shown in FIGS. 1 through 9.
Figure 9:
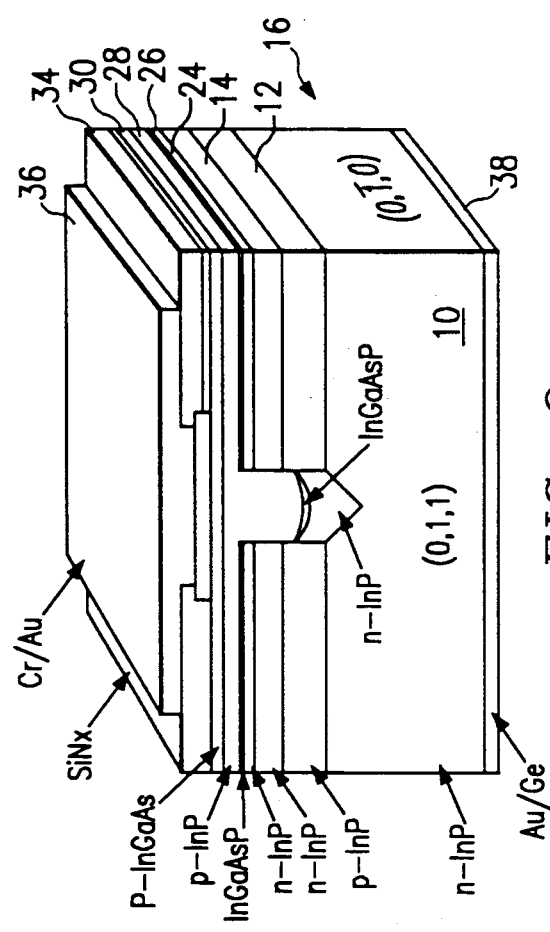
FIG. 9 is a representation of FIG. 8 after being modified to metalize the lower surface of the body and complete the process of adding an electrical connection point to form a laser device.

FIG. 11 illustrates a further body of material 60 having component portions 62 and 64, where the orientation of a groove 66 is at 90 degrees to the orientation of the groove of FIG. 3. In other words, the groove is substantially parallel to the (0,1,1) plane of crystalline material, rather than perpendicular to it as in FIG. 3. Under this orientation, the walls, such as 68, will no longer be perpendicular to the crystalline plane (1,0,0), but will rather be at an angle. However, the present process still allows a consistent definition of topography, since there is no undercutting of the mask during the etching process.

OPERATION

In practicing the present invention, a semiconductor body, such as shown in FIG. 1, which may be of a single material or may be of layers of material as shown in FIG. 1, is cleaned with a cleaning solution, such as hydrogen fluoride, to remove all organic material and traces of oxygen on the surface of the crystalline structure. This must be accomplished at a low enough temperature that further oxides are not immediately formed. A problem of the prior art was that a clean wafer or semiconductor body would be situated in an environment for a time and/or temperature conducive to the growing of a new oxide layer before commencing the mask process. As will be realized, placing a wafer on a hot tray, even though the environmental gasses may be reasonably cool, may cause a conduction of heat from the tray to the surface of the semiconductor wafer and the high temperature commences the growth of oxides on the surface of the wafer. Since the tray or surface upon which the wafer is placed can easily have hot spots and further, because the wafer can conduct the heat nonuniformly, there often were uneven growths of oxide on the surface of the body.

For the above reasons, it is extremely important that the body of semiconductor material be kept at room temperature until all traces of oxygen or oxide-forming materials in the environment are removed.

When the surface of the semiconductor body to be topographically etched is clean, a layer of mask material, such as silicon nitride, is applied to the surface as shown in FIG. 2. As previously indicated, the silicon nitride is not an exact composition. The nitrogen portion compared to the silicon may range from 1/5 to 1. In other words, there may be up to as much as approximately five times as much silicon as there is nitrogen in the crystalline structure. Photolithography or other mask techniques may be used to define a path in the silicon nitride to form the initial portion of FIG. 3, and then the silicon nitride is used as a mask &or a different type of etchant to etch the semiconductor material. All of the above is standard technology in the development of a buried crescent laser, except for keeping the semiconductor body to be topographically formed at room temperature or some temperature below which oxides will form between the time that it is cleaned of all oxides and the time that all oxide producing materials are removed from the environment in which the semiconductor body is placed. If the application of the mask, such as silicon nitride 18, could be accomplished to produce the product of FIG. 2 without raising the temperature of the semiconductor body, then the oxides wouldn't form and the problems inherent to the production of the chips would never have occurred.

Although the rest of the steps towards making the buried crescent laser are not necessary to the practice of the present invention, a brief review of FIGS. 3 through 9 will be provided.

FIG. 3 shows the end results of the channel etching. FIG. 4 illustrates the epitaxial growth of various layers of material, as previously mentioned, so that the crescent formed by layer 26 comprising indium gallium arsenide phosphate is buried below the surface of the remaining portion of the semiconductor. This crescent shaped growth is the source of the term "buried crescent laser" which is the active layer or the layer that converts the electrical current to photons. In FIG. 5, the pad 32 is formed for the purpose of providing the appropriate current confinement in the area of the active layer.

FIG. 6 provides insulating material in the form of layers 34, so that there will be no direct electrical contact between the bond pad of FIG. 7 and the semiconductor material below it. The bond pad 36 of FIG. 7 is provided merely to increase the area to which an electric connection may be made. As received the wafer is fairly thick and it is left in this condition for structural strength. However, to facilitate cleaving the wafer into appropriate size laser chips, or in other words to make the splitting (cleaving) more accurate, the wafer is thinned as shown in FIG. 8, preparatory to putting a further metallization of gold/germanium on the bottom surface, which metallization provides the other electrical contact necessary to produce the lasing action. After the metallization of FIG. 9, the wafer is scored and broken into the appropriate laser components.

FIG. 10 practices the same cleaning and mask generating techniques as shown in FIGS. 1, 2 and 3. In other words, the surface of the body 50 of FIG. 10 is cleaned and while maintained at room temperature for a total time to typically not exceed ten minutes, the body 50 is placed in an environment where all oxygen is removed. A mask such as silicon nitride is applied to the entire upper surface or (1,0,0) plane. Photoresist techniques are used to define the mesa of FIG. 10 and after the silicon mask is etched, further etchants are used to define the mesa, and then the silicon nitride is removed so that whatever further operations need to be done to the semiconductor body can be accomplished. The transition point between the vertical surface (0,−1,1) and the surface 58 will generally be rounded, but may be any of many shapes depending upon the type of etchant material used and the composition of the semiconductor body. As is known to those skilled in the art, different types of semiconductor material are etched by the etchant in different manners and thus, the transition area may vary depending upon the process involved.

The product of FIG. 11 assumes that the attempt is to produce a channel in a crystalline plane diagonally opposite that of the buried crescent laser of FIGS. 1 through 9. The crystalline family of planes (1,1,1) is typically formed when etching occurs along lines parallel to the (0,1,1) plane. The important thing is that the (1,0,0) surface after cleaning not be allowed to have any oxide buildup between it and the mask. If there is no oxide, there will be no undercutting and with no undercutting, the edges of the channel will not be ragged as occurred in the prior art conditions, but rather are linear and consistent in the width dimension across the top of the channel.

In summary, the present invention is directed towards a method of providing consistent results in the etching process as to the width of channels etched or as to the width of mesas defined during the etching process. This is accomplished by not only removing (cleaning) any oxide (and other contaminants) from the surface to be etched, but additionally by preventing any further oxide from forming between the cleaned surface and a mask material used to define the areas to be etched. The way in which the formation of the oxides is prevented, is to keep the body of material to be etched at a temperature below which oxides can form, from the time it is cleaned until the mask material is applied to the surface of the product to be etched.

While I have disclosed several embodiments of products made in accordance with my process, I wish not to be limited only to products such as described, but only to the method as described in the claims and any products produced in accordance with those methods. Accordingly,

I claim:

1. A method of etching a channel of substantially constant width in a surface of a body of semiconductor material initially covered with a native oxide, comprising the steps of:

stripping native oxide from the surface of the body of semiconductor material to be etched at essentially room temperature while the body is in an oxygen containing environment;

removing substantially all oxygen from the environment adjacent the body before subjecting the body to temperatures which will cause the addition of a further oxide layer;

covering the stripped area with a pattern configured etch mask; and etching a channel in said surface of the semiconductor material in accordance with the configuration of the mask using HCl acid to form grooves having sides of a substantially constant width.

2. A method of etching a channel of substantially vertical sides in a surface of a body of semiconductor material normally situated in an oxygen containing environment and initially covered with a native oxide, comprising the steps of:

stripping native oxide from the surface of the semiconductor material body to be etched at essentially room temperature in an oxygen containing environment;

removing substantially all oxygen from the environment adjacent the body before subjecting the body to temperatures greater than room temperature;

covering the stripped area with a patterned etch mask; and etching a channel in said surface of the semiconductor material in accordance with the pattern of the mask using a bath of HCl acid to form grooves having sides substantially perpendicular to said surface.

3. A method of fabricating a device, which includes etching a groove in a surface of a body of a Group III-V compound semiconductor material initially covered with a native oxide, comprising the steps of:

(a) removing native oxide on said surface at essentially room temperature and in an oxygen containing environment, (b) removing substantially all oxygen from the environment adjacent the body before subjecting the body to temperatures substantially greater than room temperature, (c) forming on said surface a dielectric layer of SiNx which is essentially impervious to an etchant of HCl acid, (d) patterning said dielectric layer to form openings therein, and (e) exposing said body and said layers to said etchant to form said groove.

4. A method of fabricating an arrowhead laser device, which includes etching a vertical sided groove into a (1,0,0)-oriented surface of an InP body initially covered with a native oxide, comprising the steps of:

(a) removing native oxide layer from said surface while said body is essentially at room temperature and in an oxygen containing atmosphere, (b) removing substantially all the oxygen from the environment adjacent the body before increasing the temperature, to which the body is exposed, above room temperature, (c) depositing a SiNx mask on said oxide free (1,0,0)-oriented surface of the InP body, (d) patterning said mask to form elongated openings which extend parallel to the (0,1,1) direction, and (e) exposing said body and said layers to an etchant at essentially room temperature for a time to cut a groove in the configuration of said mask having sides substantially perpendicular to said (1,0,0)-oriented surface.

5. A method of providing topography definition of a given surface of a semiconductor body initially covered with a native oxide, wherein mask undercutting of the substrate is eliminated during the etching process comprising the steps of:

removing native oxide from said given surface, while said surface is in an oxygen containing atmosphere, at a temperature low enough to minimize the formation of a new oxide layer on said given surface;

placing said semiconductor body in a substantially oxygen free environment before a new layer of oxide material is formed on said given surface;

defining a patterned mask impervious to an etchant on said surface of said body; and etching said surface of said body in the areas not covered by said patterned mask with said etchant wherein substantially vertical walls are defined in the (0−1,1) crystal plane of the body.

6. A method of providing topography definition of a given surface of a multilayer semiconductor body initially covered with a native oxide having a mask on the (1,0,0) crystal surface wherein mask undercutting of the substrate is eliminated during the etching process comprising the steps of:

removing native oxide from said given surface at a temperature essentially that of room temperature and in an oxygen containing environment;

placing said semiconductor body in a substantially oxygen free environment wherein said body is initially at room temperature;

defining a SiNx, wherein x is any number between 0.2 and 1, patterned mask which is impervious to an HCl etchant on said surface of said body; and etching said surface of said body in the areas not covered by said patterned mask with HCl acid wherein substantially vertical walls are defined in the (0,−1,1) crystal plane of the body.

7. A method of producing an arrowhead laser device from a body of semiconductor n-InP (n-type Indium Phosphate) material having an p-InP (p-type Indium Phosphide) semiconductor first layer on a (1,0,0) crystal surface thereof and a n-InP semiconductor second layer on said first layer said second layer initially covered with a native oxide, comprising the steps of:

removing native oxide from the (1,0,0) crystal surface of said second layer while maintaining said body at essentially room temperature in an oxygen containing environment;

placing said semiconductor body in a substantially oxygen free environment wherein said body is initially at essentially room temperature;

applying a mask pattern which is impervious to a given etchant to said surface of said (1,0,0) crystal surface of said body; and etching said (1,0,0) crystal surface of said body in the areas not covered by said mask pattern with HCl acid wherein substantially vertical walls are defined in the (0,−1,1) crystal plane of the body through said semiconductor first and second layers by the etchant and the etchant further acts to remove a small amount of material from the n-InP body in the (1,1,1) crystal plane;

removing said mask;

subjecting said body to an atmosphere whereby a semiconductor third layer of n-InP is grown on the (1,0,0) plane of said second layer and in the etched areas defined by said mask;

growing on said body a semiconductor fourth layer of InGaAsP (Indium Gallium Arsenide Phosphate) on the (1,0,0) plane of said third layer and in the etched areas defined by said mask;

growing on said body a semiconductor fifth layer of p-InP on the (1,0,0) plane of said fourth layer and in the etched areas defined by said mask;

growing on said body a semiconductor sixth layer of p-InGaAs (Indium Gallium Arsenic) on the (1,0,0) plane of said fifth layer;

metalizing a portion of the surface of said semiconductor sixth layer over the previously etched area with the first Au (gold), then Zn (zinc) and then more Au;

depositing an insulating SiNx seventh layer, wherein x is within the range of 0.2 to 1, on said sixth layer in areas other than said metalized portion covering the previously etched area; and metalizing a portion of opposite surfaces of said body, surrounding and including said previously metalized portion with a layer of Cr (chronium) and then a layer of Au to form a bond pad for the laser element.

8. A method of producing mesas on a given surface of a semiconductor body initially covered with a native oxide, wherein undercutting the mesa area is prevented during the process of etching the body around the mesa area, comprising the steps of:

removing native oxide from said given surface at a temperature essentially that of room temperature in an oxygen containing environment;

placing said room temperature semiconductor body in a substantially oxygen free environment;

depositing a mask pattern impervious to an etchant on said surface of said body in the area of the mesa; and etching said surface of said body with said etchant in the areas not covered by said mask pattern.

9. The method of claim 8 wherein the etchant is a solution of $HBr;H_3PO_4;K_2Cr_2O_7;H_2O$ (Hydrogen Bromide, Phosphoric acid, Potassium Dichromate and Water) and wherein substantially vertical walls are defined in the $(0,-1,1)$ crystal plane of the body.

* * * * *